United States Patent
Wen

(10) Patent No.: US 10,359,709 B2
(45) Date of Patent: Jul. 23, 2019

(54) EXPOSURE APPARATUS AND PREVENTION METHOD AND SYSTEM FOR IMAGE OFFSET THEREOF

(71) Applicants: HKC CORPORATION LIMITED, Shenzhen (CN); CHONGQING HKC OPTOELECTRONICS TECHNOLOGY CO., LTD., Jieshi, Banan District (CN)

(72) Inventor: Chun-bin Wen, Jieshi (CN)

(73) Assignees: HKC CORPORATION LIMITED, Shenzhen (CN); Chongqing HKC Optoelectronics Technology Co., Ltd., Jieshi, Banan District (CN)

( * ) Notice: Subject to any disclaimer, the term of this patent is extended or adjusted under 35 U.S.C. 154(b) by 0 days.

(21) Appl. No.: 15/743,871

(22) PCT Filed: Aug. 31, 2017

(86) PCT No.: PCT/CN2017/100028
§ 371 (c)(1),
(2) Date: Jan. 11, 2018

(87) PCT Pub. No.: WO2018/129933
PCT Pub. Date: Jul. 19, 2018

(65) Prior Publication Data
US 2019/0064681 A1    Feb. 28, 2019

(30) Foreign Application Priority Data

Jan. 11, 2017 (CN) .......................... 2017 1 0020601

(51) Int. Cl.
G03F 7/20 (2006.01)

(52) U.S. Cl.
CPC ...... *G03F 7/70883* (2013.01); *G03F 7/70016* (2013.01); *G03F 7/7085* (2013.01); *G03F 7/70716* (2013.01)

(58) Field of Classification Search
CPC .... G03F 7/20; G03F 7/70883; G01N 23/2204
USPC .............................................. 355/53, 72–76
See application file for complete search history.

(56) References Cited

U.S. PATENT DOCUMENTS

2014/0312227 A1* 10/2014 Yoshikawa ........ G01N 23/2204
250/310

* cited by examiner

*Primary Examiner* — Hung Nguyen
(74) *Attorney, Agent, or Firm* — Bond Schoeneck & King, PLLC; George McGuire

(57) ABSTRACT

Provided are an exposure apparatus and a prevention method and system for image offset of the exposure apparatus. The dust cover which is made of transparent material and arranged and arranged at one end of the bearing connected to the lifter enables to check whether the bearing is abraded via manual vision or machine vision, thereby enhancing the yield of the glass substrates achieved by photoetching in the photo process and thus improving the production efficiency of the photo process.

10 Claims, 7 Drawing Sheets

EXPOSURE APPARATUS AND PREVENTION METHOD AND SYSTEM FOR IMAGE OFFSET THEREOF

CROSS-REFERENCE TO RELATED APPLICATIONS

This application is the United States National Phase Entry of PCT Application No. PCT/CN2017/100028 filed on Aug. 31, 2017, which claims priority to Chinese patent application No. 201710020601.2, filed on Jul. 11, 2017, the entire disclosure of each of which is incorporated herein by reference.

TECHNICAL FIELD

The present disclosure relates to the technical field of exposure device, in particular relates to an exposure apparatus and a prevention method and system for image offset thereof.

BACKGROUND

In the photo process, the glass substrate is coated with photo resistance by the glue spreader and enters into the exposure apparatus for exposure, so that the area covered by the photo resistance in the glass substrate may form a photo resistance image. In practice, if a foreign matter exists on the carrier of the exposure apparatus, a partial upheaval may occur on the glass substrate where the foreign matter lies and thus lead to a partial offset in the photo resistance image, thereby reducing the yield of the glass substrates achieved by photoetching in the photo process.

The foreign matter on the carrier of the exposure apparatus is commonly formed by the dropped debris from the abrasion of the bearing for the lifter in the exposure apparatus. Since the lifter is often manually operated, whether the bearing is abraded is determined according to hand feeling. However, it is easy to get a false determination and low checking efficiency, thereby significantly reducing the production efficiency of the photo process.

SUMMARY

The present disclosure provides an exposure apparatus and a prevention method and system for image offset thereof. A dust cover which is made of transparent material and arranged at one end of the bearing connected to the lifter enables to check whether the bearing is abraded via manual vision or machine vision, thereby effectively preventing a partial offset of the photo resistance image formed by the dropped debris from the abrasion of the bearing, enhancing the yield of the glass substrates achieved by photoetching in the photo process and thus improving the production efficiency of the photo process.

According to an aspect, embodiments of the present disclosure provides an exposure apparatus, including: a main shell, a carrier, an exposure component and a lifter bearing; the carrier, the exposure component and the lifter bearing are arranged in the main shell, the lifter bearing is mechanically connected to the carrier and the exposure component, the lifter bearing includes:

a bearing mechanically connected to the exposure component;

a lifter mechanically connected to the bearing and configured to rotate around the bearing to control the lift up and down of the exposure component; and a dust cover arranged at the external side of one end of the bearing connected to the lifter, the dust cover is made of transparent material.

Embodiments of the present disclosure further provides a prevention method for image offset of the exposure apparatus, the exposure apparatus is the exposure apparatus described above, the prevention method includes:

determining whether the bearing is abraded;

if the bearing is abraded, sending an alarm message which indicates that the bearing is abraded.

According to another aspect, embodiments of the present disclosure provides a prevention system for image offset of the exposure apparatus, the exposure apparatus is the exposure apparatus described above, the system includes at least one processor and a memory connected to the processor, the memory stores instructions which may be executed by the at least one processor, and the at least one processor executes the instructions to perform operations of:

determining whether the bearing is abraded; and if the bearing is abraded, sending an alarm message which indicates that the bearing is abraded.

In embodiments of the present disclosure, an exposure apparatus and a prevention method and system for image offset thereof are provided. A dust cover, which is made of transparent material and arranged at one end of the bearing connected to the lifter enables to check whether the bearing is abraded via manual vision or machine vision, thereby effectively preventing a partial offset of the photo resistance image formed by the dropped debris from the abrasion of the bearing, enhancing the yield of the glass substrates achieved by photoetching in the photo process and thus improving the production efficiency of the photo process.

BRIEF DESCRIPTION OF DRAWINGS

In order to make a clear description for the technical solutions in embodiments of the present disclosure, a simple description about the drawings used in the embodiments of the present disclosure is given as below. Apparently, the drawings illustrated herein are some embodiments of the present disclosure. Based on the drawings here, other drawings may be achieved by those skilled in the art without creative works.

DETAILED DESCRIPTION

The terms such as "comprising", "including" and their transformations used in the detailed description, claims and drawings are intended to cover the non-exclusive inclusion, for example, process, method, system, product, device, which include a series of steps or units, are not limited to the listed steps or units, and optionally further include unlisted steps or units, or optionally further include other inherent steps or units of the process, method, product or device. In addition, the terms such as "first", "second", etc. are used to distinguish one object from another, but not to describe the specific order.

Figure 1:
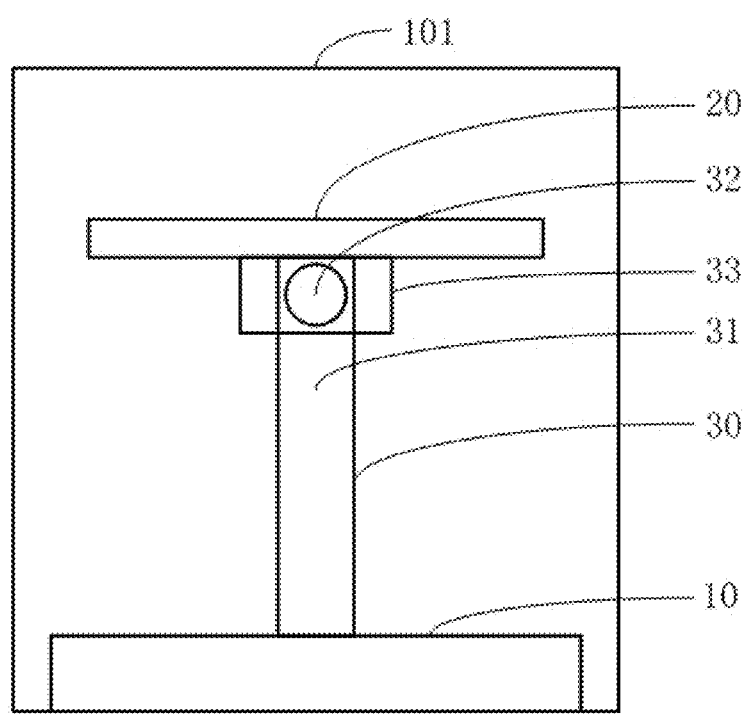
FIG. 1 is a structure diagram of an exposure apparatus provided in an embodiment of the present disclosure.

As shown in FIG. 1, an exposure apparatus 100 provided in an embodiment of the present disclosure includes a main shell 101, a carrier 10, an exposure component 20 and a lifter bearing 30. The lifter bearing 30 includes a bearing 31, a lifter 32 and a dust cover 33.

The carrier 10 is configured to bear the glass substrate.

The exposure component 20 is arranged at a preset distance above the carrier 10 and configured to expose the glass substrate on the carrier.

The lifter bearing 30 is mechanically connected to the carrier 10 and the exposure component 20, and is configured to control the up and down of the exposure component 20.

The bearing 31 is mechanically connected to the exposure component 20.

The bearing may be arranged at the bottom, top or side of the exposure component. The bearing only needs to be fastened to the exposure component and not affect the exposure of the exposure component. In this embodiment, the bearing is arranged at the side of the exposure component.

The lifter 32 is mechanically connected to the bearing 31 and is configured to rotate around the bearing 31 to control the up and down of the exposure component.

The lifter is arranged at the external side of one end of the bearing and connected to the bearing via a fastener. Optionally, the lifter is provided with a connecting hole, through which the bearing passes to be connected to the lifter. In this embodiment, the lifter is provided with a connecting hold passing through the bearing.

A dust cover 33, which is made of transparent material, is arranged at the external side of one end of the bearing 31 connected to the lifter 32.

The dust cover may be fixed to the external side of the end of the bearing by means of a threaded connection or a fastener, so as to prevent dust. The transparent material used to manufacture the dust cover may be high silica glass, quartz glass or acrylic glass, and the material may also be other transparent materials. In this embodiment, the acrylic material may is used manufacture the dust cover.

In this embodiment, a dust cover, which is made of transparent material, at one end of the bearing connected to the lifter enables to check whether the bearing is abraded via manual vision or machine vision, thereby effectively preventing a partial offset of the photo resistance image formed by the dropped debris from the abrasion of the bearing, enhancing the yield of the glass substrates achieved by photoetching in the photo process and thus improving the production efficiency of the photo process.

Figure 2:
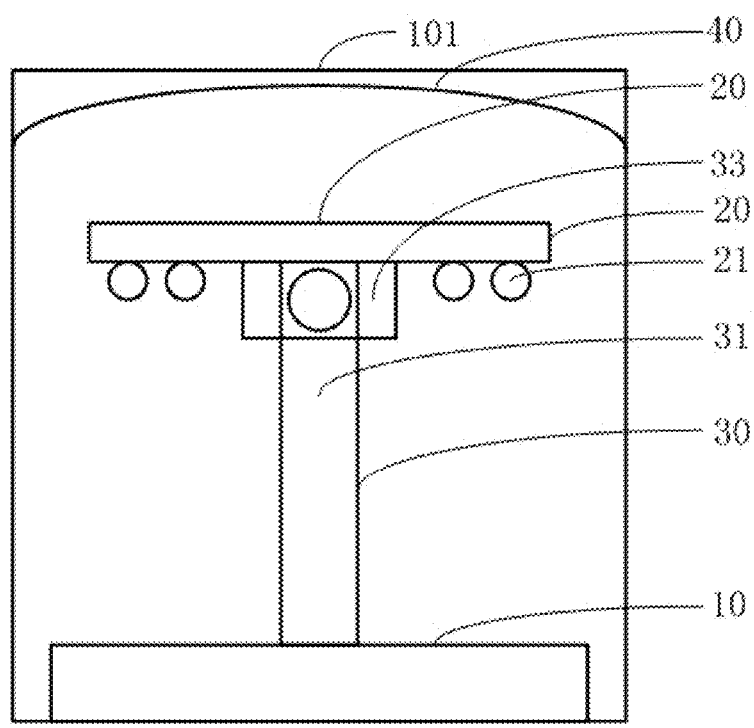
FIG. 2 is a structure diagram of an exposure apparatus provided in another embodiment of the present disclosure.

As shown in FIG. 2, in an embodiment of the present disclosure, the exposure component 20 includes a light source 21. The exposure apparatus 100 further includes a dust cover 40.

The light source 21 is arranged to face to the carrier 10 and is configured to irradiate the glass substrate.

The light source may be a scattering light source, a point light source or a collimated light source. The light source may also be selected as a capillary lamp, a long arc lamp, a short arc lamp or an ultraviolet lamp.

The reflection lampshade 40, which is arranged in the main shell 101 and above the light source 21, is configured to reflect the light emitted by the light source 21 to the glass substrate.

The reflection lampshade may be a scattering type lampshade. In this embodiment, the reflection lampshade may a lampshade with an arc symmetry structure.

Figure 3:
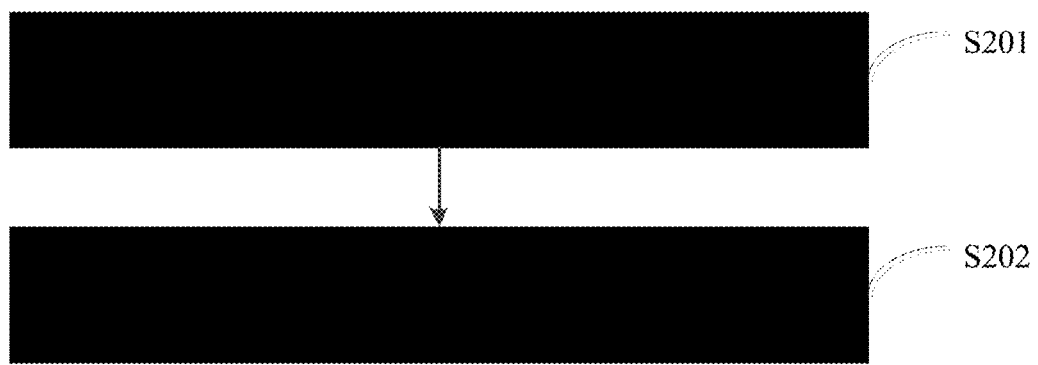
FIG. 3 is a flow block diagram of a prevention method for image offset of the exposure apparatus provided in an embodiment of the present disclosure.

As shown in FIG. 3, in an embodiment of the present disclosure, a prevention method for image offset of the exposure apparatus is provided. The exposure apparatus is the exposure apparatus in embodiments corresponding to FIG. 1 and FIG. 2. The method includes steps described below.

In step S201, whether a bearing is abraded is determined.

Whether the bearing is abraded may be checked by acquiring a present bearing image via manual vision or machine vision.

In an embodiment of the present disclosure, the step S201 includes:

acquiring the present bearing image;

comparing an offset between the present bearing image and a prestored bearing image with a preset offset range;

if the offset is within the preset offset range, determining that the bearing is not abraded; if the offset is not within the preset offset range, determining that the bearing is abraded.

In some embodiments, the present bearing image may be acquired by using video products with image acquisition functions, e.g. a camera.

Figure 4:
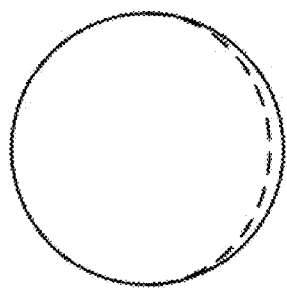
FIG. 4 is a schematic diagram of the bearing image offset provided in an embodiment of the present disclosure.

Normally, when a bearing is not abraded, the section image of the bearing is close to a standard circle; if the bearing is abraded, a defect occurs at the abraded position of the section image. FIG. 4 is a diagram illustrating a bearing before and after being abraded, where the solid line represents the outline of the bearing before being abraded and the dash line represents the outline of the bearing after being abraded.

In an embodiment of the present disclosure, when the bearing is not abraded, the bearing image may be acquired and stored as a prestored bearing image. When the exposure apparatus is used, the present bearing image may be acquired under the same conditions for image acquiring, and the pixels at the same place between the present bearing image and the prestored bearing image may be compared under the same display conditions. In the comparison between the acquired present bearing image and the prestored bearing image, if the number of the pixels with difference is larger than a first threshold, it is determined that the bearing is seriously abraded; if the number of the pixels with difference is equal to/less than the first threshold, it is determined that the bearing is slightly abraded.

In step S202, if the bearing is abraded, an alarm message, which indicates that the bearing is abraded, is sent.

The alarm message may be a voice, a text, a graphic image or lighting.

This embodiment provides a prevention method for image offset of the exposure apparatus, which enables to determine whether the bearing is abraded by acquiring and analyzing the bearing image. The prevention method is simple and efficient, and may effectively avoid the offset of the exposure image caused by the abrasion to the bearing.

Figure 5:
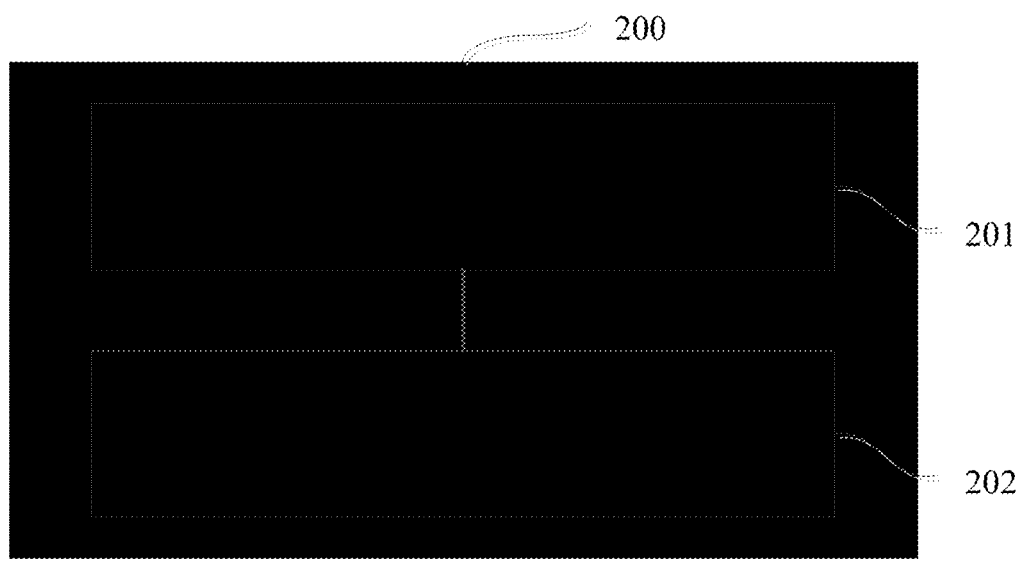
FIG. 5 is a structure diagram of a prevention system for image offset of the exposure apparatus provided in an embodiment of the present disclosure.

As shown in FIG. 5, an embodiment of the present disclosure provides a prevention system 200 for image offset of the exposure apparatus, which is configured to perform the steps of the method in the embodiment corresponding to FIG. 3. The system 200 includes:

a checking unit 201 configured to check whether the bearing is abraded;

an alarm unit 202 configured to, if the bearing is abraded, send an alarm message which indicates that the bearing is abraded.

Figure 7:
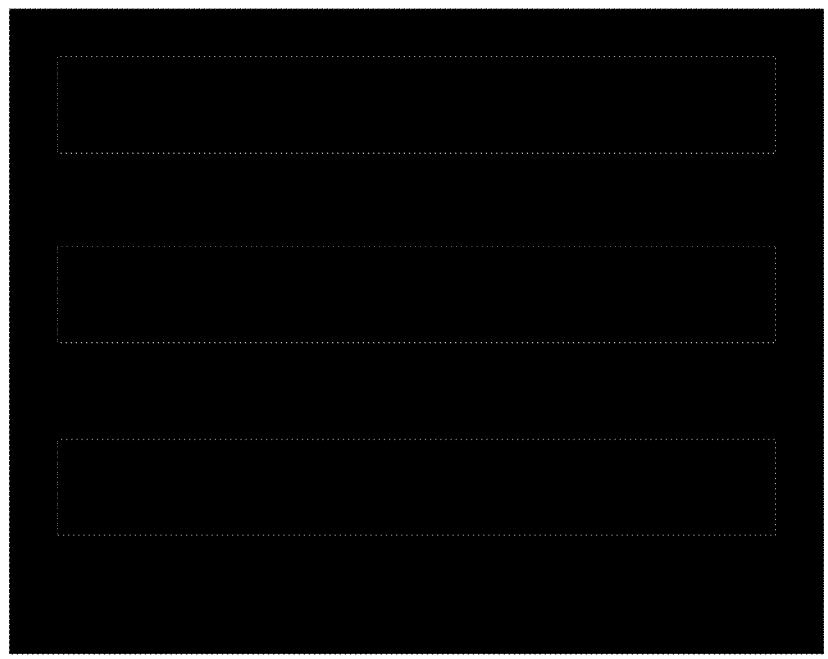
FIG. 7 is a structure diagram of the checking unit in FIG. 5.

As shown in FIG. 7, in an embodiment of the present disclosure, the checking unit 201 includes:

an image acquisition unit 2011 configured to acquire the bearing image;

a comparison unit 2012 configured to compare the offset between the present bearing image and the prestored bearing image with the preset offset range;

a determination unit 2013 configured to, if the offset is within the preset offset range, determine that the bearing is not abraded; or, if the offset is not within the preset offset range, determine that the bearing is abraded.

The image acquisition unit may be a camera, the comparison unit may be an image processor, and the determination unit may be implemented by a processor.

This embodiment provides a prevention system for image offset of the exposure apparatus, which enables to determine whether the bearing is abraded by acquiring and analyzing the bearing image. The prevention method is simple and efficient, and may effectively avoid the offset of the exposure image caused by the abrasion to the bearing.

Figure 6:
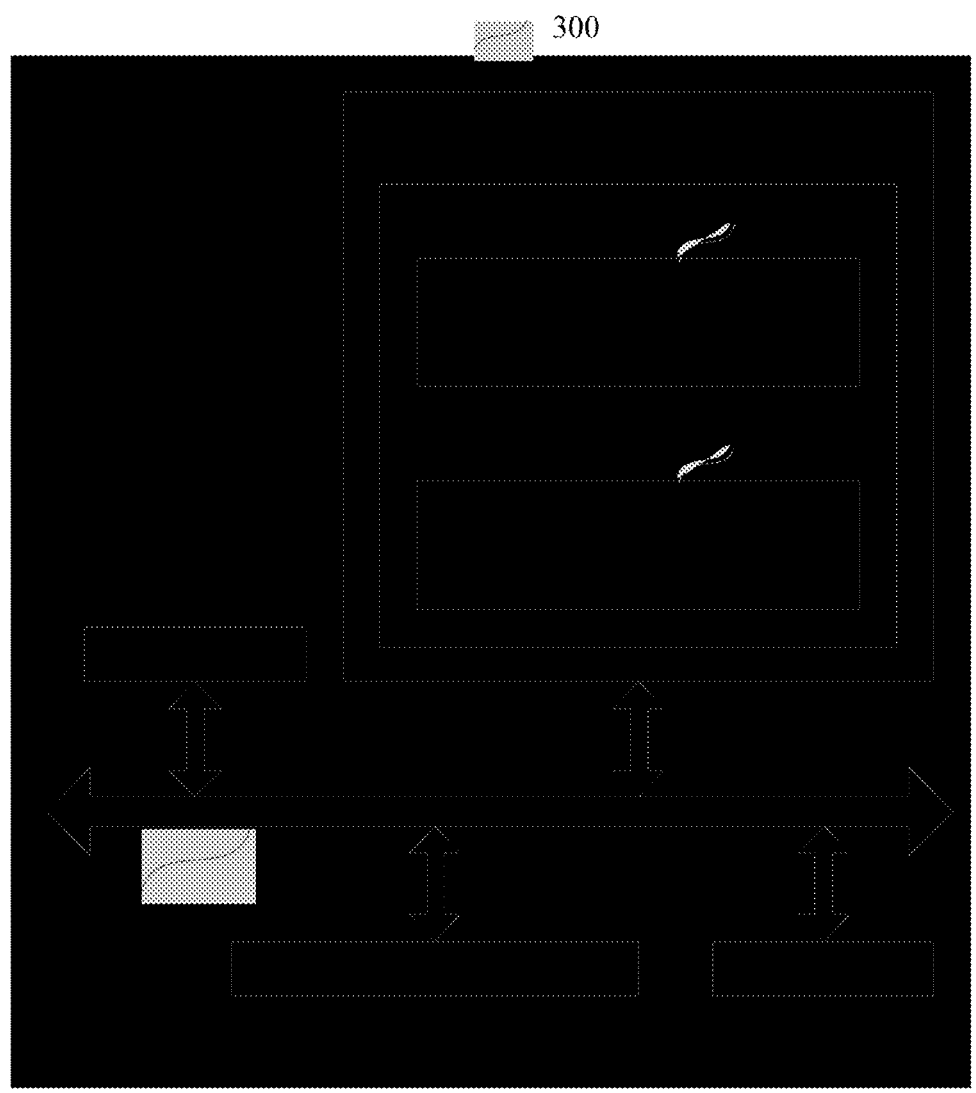
FIG. 6 is a structure diagram of another prevention system for image offset of the exposure apparatus provided in an embodiment of the present disclosure.

As shown in FIG. 6, this embodiment provides a prevention system 300 for image offset of the exposure apparatus, including: a processor 110, a communication interface 120, a memory 130, a bus 140 and a camera 150.

The processor 110, the communication interface 120, the memory 130 and the camera 150 may communicate with each other through the bus 140.

The communication interface 120 is configured to communicate with external devices, such as personal computers and smart phones, etc.

The processor 110 is configured to execute a program 131.

The program 131 may include program codes, which include computer instructions.

The processor 110 may be a central processing unit (CPU), or an application specific integrated circuit (ASIC), or configured to be one or more integrated circuits for implementing embodiments of the present disclosure. The memory 130 is configured to store the program 131. The memory 130 may include a high speed random access memory (RAM), or further include a non-volatile memory, e.g. at least one disk storage. The program 131 may include a checking unit 1311 configured to check whether the bearing is abraded; an alarm unit 1312 configured to, if the bearing is abraded, send an alarm message which indicates that the bearing is abraded.

In an embodiment of the present disclosure, the program 131 further includes:

an image acquisition unit configured to acquire the present bearing image;

a comparison unit configured to compare the offset between the present bearing image and the prestored bearing image with the preset offset range;

a determination unit configured to, if the offset is within the preset offset range, determine that the bearing is not abraded; or, if the offset is not within the preset offset range, determine that the bearing is abraded.

The units in all embodiments of the present disclosure may be implemented by using a general integrated circuit, e.g. a CPU or ASIC.

The steps of the method in embodiments of the present disclosure may be reordered, combined and deleted according to practical requirements.

The units of the apparatus in embodiments of the present disclosure may be combined, divided and deleted according to practical requirements.

Those skilled in the art may understand, the whole or partial process of the method in the present disclosure may be completed by using related hardware which is instructed by the computer program. The program may be stored in a computer-readable storage medium. The program, when being executed, may include the process in the embodiments of the above method. The storage medium may be a diskette, CD, read-only memory (ROM) or RAM, etc. It should be noted that the above contents are only preferred embodiments of the present disclosure and are not limited to the present disclosure. Any amendments, equivalent substitutions and improvements in accordance within the spirit and principle of the present disclosure may fall into the scope of protection of the present disclosure.

What is claimed is:

1. A prevention method for image offset of an exposure apparatus, the exposure apparatus comprising a main shell, a carrier, an exposure component and a lifter bearing, wherein the carrier, the exposure component and the lifter bearing are arranged in the main shell, the lifter bearing is mechanically connected to the carrier and the exposure component, the lifter bearing comprises: a bearing mechanically connected to the exposure component; a lifter mechanically connected to the bearing and configured to rotate around the bearing to control the lift up and down of the exposure component; and a dust cover arranged at the external side of one end of the bearing connected to the lifter, the dust cover is made of transparent material, the method comprises:

checking whether the bearing is abraded by viewing through the dust cover made of transparent material;

when the bearing is abraded, sending an alarm message indicating that the bearing is abraded.

2. The method according to claim 1, wherein the checking whether the bearing is abraded comprises:
acquiring a present bearing image;
comparing an offset between the present bearing image and a prestored bearing image with a preset offset range;
when the offset is within the preset offset range, determining that the bearing is not abraded; when the offset is not within the preset offset range, determining that the bearing is abraded.

3. The method according to claim 2, wherein the section of the bearing in the prestored bearing image is circular.

4. A prevention system for image offset of an exposure apparatus, the exposure apparatus comprising a main shell, a carrier, an exposure component and a lifter bearing, wherein the carrier, the exposure component and the lifter bearing are arranged in the main shell, the lifter bearing is mechanically connected to the carrier and the exposure component, the lifter bearing comprises: a bearing mechanically connected to the exposure component; a lifter mechanically connected to the bearing and configured to rotate around the bearing to control the up and down of the exposure component; and a dust cover arranged at the external side of one end of the bearing connected to the lifter, the dust cover is made of transparent material, the system comprises: at least one processor and a memory connected to the processor, wherein the memory stores instructions executable by the at least one processor, the at least one processor executes the instructions to perform operations of:

checking whether the bearing is abraded by viewing through the dust cover made of transparent material; and when the bearing is abraded, sending an alarm message indicating that the bearing is abraded.

5. The system according to claim 4, wherein
the at least one processor executes the instructions to perform operations of:

acquiring a present bearing image;

comparing an offset between the present bearing image and a prestored bearing image with a preset offset range; and when the offset is within the preset offset range, determining that the bearing is not abraded; when the offset is not within the preset offset range, determining that the bearing is abraded.

6. The system according to claim 5, wherein
the section of the bearing in the prestored bearing image is circular.

7. The system according to claim 5, further comprising:
a communication interface, a bus and a camera, wherein
the communication among the at least one processor, the communication interface, the memory and the camera is performed through the bus.

8. The system according to claim 6, wherein
the camera is configured to acquire the bearing image.

9. The system according to claim 4, wherein
the alarm message indicating that the bearing is abraded is a voice, a text, an image or the combination thereof.

10. The system according to claim 4, wherein
the comparison of the offset between the present bearing image and the prestored bearing image comprises: comparing the pixels at the same place between the present bearing image and the prestored bearing image; when the number of the pixels with difference is larger than a first threshold, determining that the bearing is abraded.

* * * * *